(12) United States Patent
Rauwolf et al.

(10) Patent No.: US 11,209,377 B2
(45) Date of Patent: Dec. 28, 2021

(54) METHODS AND APPARATUSES FOR COMPENSATING FOR MOISTURE ABSORPTION

(71) Applicant: Andrew Wireless Systems GmbH, Buchdorf (DE)

(72) Inventors: Thomas Rauwolf, Minderoffingen (DE); Patrick Braun, Munningen (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 0 days.

(21) Appl. No.: 16/748,140

(22) Filed: Jan. 21, 2020

(65) Prior Publication Data

US 2020/0284745 A1    Sep. 10, 2020

Related U.S. Application Data

(60) Provisional application No. 62/813,901, filed on Mar. 5, 2019.

(51) Int. Cl.
| | | |
|---|---|---|
| *G01N 27/22* | (2006.01) | |
| *G01N 5/02* | (2006.01) | |
| *H05K 1/02* | (2006.01) | |

(52) U.S. Cl.
CPC ........... *G01N 27/223* (2013.01); *G01N 5/025* (2013.01); *G01N 27/221* (2013.01); *H05K 1/0268* (2013.01)

(58) Field of Classification Search
CPC .... G01N 27/223; G01N 5/025; G01N 27/221; H05K 1/0268; H05K 1/162; H05K 2201/10151

USPC ..... 361/303; 73/74; 324/750.3, 519, 762.01, 324/762.02, 762.05, 762.06, 763.01
See application file for complete search history.

(56) References Cited

U.S. PATENT DOCUMENTS

| | | | | |
|---|---|---|---|---|
| 5,730,165 | A * | 3/1998 | Philipp | .................. E03C 1/057 |
| | | | | 137/1 |
| 2006/0224345 | A1* | 10/2006 | Ives | ...................... H05K 1/0201 |
| | | | | 702/107 |
| 2007/0217173 | A1* | 9/2007 | Mizutani | .............. H05K 9/0016 |
| | | | | 361/760 |
| 2008/0093112 | A1* | 4/2008 | Kushta | ..................... H05K 1/16 |
| | | | | 174/260 |
| 2008/0236876 | A1* | 10/2008 | Kodama | .................. G02B 6/43 |
| | | | | 174/260 |

(Continued)

OTHER PUBLICATIONS

International Searching Authority, "International Search Report and Written Opinion from PCT Application No. PCT/EP2020/055654", from Foreign Counterpart to U.S. Appl. No. 16/748,140, filed Jun. 9, 2020, pp. 1 through 14, Published: WO.

(Continued)

*Primary Examiner* — Christopher P McAndrew
*Assistant Examiner* — Zannatul Ferdous
(74) *Attorney, Agent, or Firm* — Fogg & Powers LLC (57) ABSTRACT

A technique to characterize moisture in a dielectric layer of a printed circuit board is provided. A method comprises applying a test signal to test circuitry comprising a test capacitor that is formed with the dielectric layer of the printed circuit board; measuring at least one characteristic of a least one of signal transmission and signal reflection from the test circuitry; and determining, from the at least one measured characteristic, at least one parameter value indicative of moisture content in the dielectric layer.

18 Claims, 8 Drawing Sheets

(56) References Cited

U.S. PATENT DOCUMENTS

2012/0217987 A1* 8/2012 Kuczynski ......... G01R 31/2817
324/756.01
2012/0228109 A1   9/2012 Wang et al.
2012/0258723 A1* 10/2012 Kim ..................... H04W 48/08
455/452.1
2018/0249573 A1   8/2018 Becker

OTHER PUBLICATIONS

Analog Devices, "24-Bit Capacitance-to-Digital Converter with Temperature Sensor", AD7747, 2007, pp. 1 through 28, Analog Devices, Inc.

* cited by examiner

METHODS AND APPARATUSES FOR COMPENSATING FOR MOISTURE ABSORPTION

CROSS-REFERENCE TO RELATED APPLICATIONS

The present application claims benefit of U.S. patent application Ser. No. 62/813,901, filed Mar. 5, 2019; the entire contents of the aforementioned patent application are incorporated herein by reference as if set forth in its entirety.

BACKGROUND

Transmitters are used in communications systems such as base stations and distributed antenna systems. Transmitters typically employ power amplifiers to boost the power of a transmitted signal. The power amplifiers may be built with printed circuit boards (PCBs).

Power amplifiers may be built and tested in one environment and used in a different environment. The two environments may have different humidity levels. As a result, the moisture absorption by insulating material of PCBs may be greater in one environment than the other environment. Variations in moisture in the insulating material affect the dielectric constant of the insulating material, and loss tangent of a transmission line made with the insulating material. Changes to dielectric constant and loss tangent affects respectively impedance values, and loss of transmission lines and capacitance values of capacitors formed with the insulating material.

The moisture on surface of the transmission line caused by humidity will affect the propagation properties especially for higher frequency (skin effect); the moisture can subsequently penetrate the dielectric affecting capacitance values and affecting transmission line impedance. Moisture in the insulating material of a PCB can be removed by heating a circuit formed with the PCB. Then, the circuit can be hermetically sealed to preclude subsequent moisture intrusion into the insulating material. However, this may be cost prohibitive for many applications. Therefore, there is a need for a more cost-effective technique to address moisture intrusion in the dielectric material of PCBs.

SUMMARY

A method is presented. The method comprises applying a test signal to test circuitry comprising a test capacitor that is formed with a dielectric layer of a printed circuit board; measuring at least one characteristic of a least one of signal transmission and signal reflection from the test circuitry; and determining, from the at least one measured characteristic, at least one parameter value indicative of moisture content in the dielectric layer.

DRAWINGS

Understanding that the drawings depict only exemplary embodiments and are not therefore to be considered limiting in scope, the exemplary embodiments will be described with additional specificity and detail using the accompanying drawings, in which.

DETAILED DESCRIPTION

In the following detailed description, reference is made to the accompanying drawings that form a part hereof, and in which is shown by way of illustration specific illustrative embodiments. However, it is to be understood that other embodiments may be utilized, and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments of the invention determine a change in capacitance due to moisture content in a dielectric layer of a PCB. Optionally, the invention may determine the amount of moisture in the PCB. A user and/or system may be alerted to excessive moisture content.

Rather than initially eliminating moisture and preventing subsequent moisture intrusion—as discussed above, an alternative and more cost-effective technique may be optionally used with the above described embodiments. Primary circuitry made on and/or with the PCB can include moisture compensation circuitry (or a portion thereof) to compensate for variations in moisture content in the dielectric of the PCB. The primary circuitry may be any circuitry for example any analog, digital, and/or mixed signal circuitry. For pedagogical purposes, a power amplifier will be subsequently illustrated.

In one embodiment, the moisture compensation circuitry comprises a moisture sensor circuitry and circuitry for adjusting phase and/or gain. The moisture sensor circuitry measures a parameter indicative of moisture content in the dielectric material of the PCB, and generates a control signal indicating a corresponding change in phase and/or gain. The circuitry for adjusting phase and/or gain is configured to receive the control signal. Based upon the control signal, the circuitry for adjusting phase and/or gain modifies the phase and/or gain of signals passing through it.

Only a portion of the moisture compensation circuitry need be formed with the PCB, e.g. at least one dielectric layer of the PCB and a conductor on or in the PCB. The circuitry for adjusting phase and/or gain may be located elsewhere in a signal chain comprising the primary circuit. Further, the circuitry for adjusting phase and/or gain may or may not be co-located with the moisture sensor circuitry.

Figure 1:
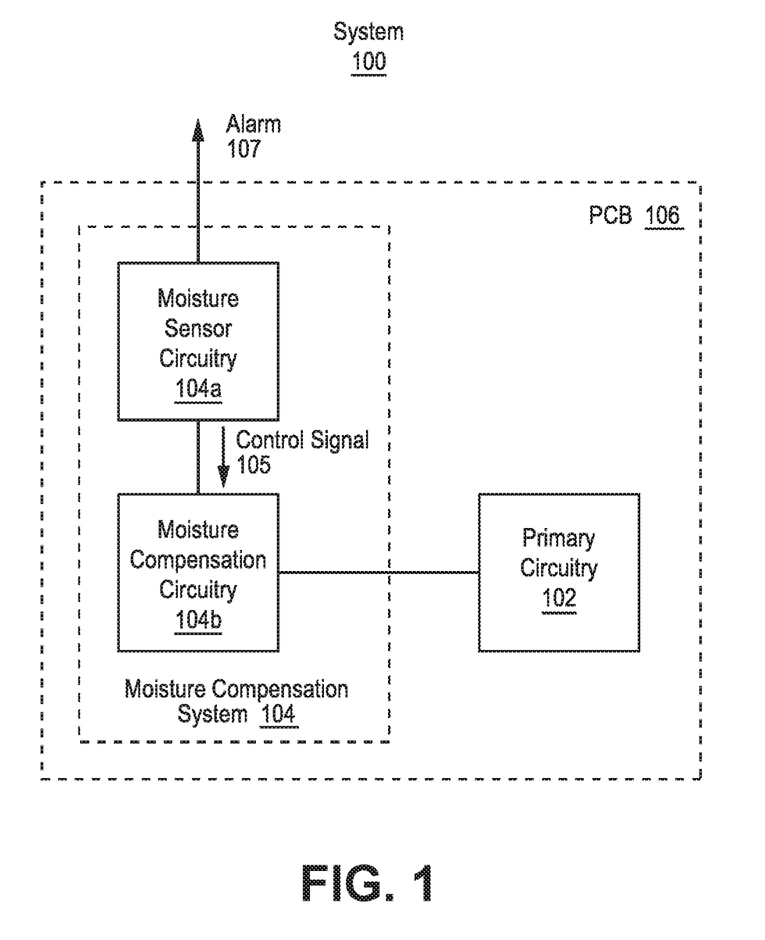
FIG. 1 illustrates one embodiment of a system for compensating for moisture absorption in primary circuitry.

FIG. 1 illustrates one embodiment of a system for compensating for moisture absorption in primary circuitry (system) 100. The system 100 comprises primary circuitry 102 coupled to moisture compensation system 104. The moisture compensation system 104 comprises moisture sensor circuitry 104a. Optionally, the moisture compensation system 104 (for example the moisture sensor circuitry 104a) is configured to send an alarm 107, e.g. an alarm signal, to another system or to a user—as is otherwise described herein. Optionally, the moisture compensation system 104 includes moisture compensation circuitry 104b coupled to the moisture sensor circuitry 104a. The moisture sensor circuitry 104a is configured to generate a control signal 105 that controls the moisture compensation system 104. FIG. 1 illustrates that the primary circuitry 102, the moisture sensor circuitry 104a, and the moisture compensation circuitry 104b are all fabricated using a PCB 106. However, as discussed above, the moisture compensation circuitry 104b need not be formed using the PCB 106, and may be implemented elsewhere in a signal chain (before and/or after the primary circuitry 102). FIG. 1, however, illustrates the moisture compensation circuitry 104b coupled before the primary circuitry 102.

The primary circuitry 102 may be a power amplifier used in a transmit signal chain of a communications system, or any other type of circuitry used in any other type of signal chain. Signal chain means a system of components coupled together, e.g. serially, to perform any type of analog, digital, and/or mixed signal processing.

Figure 2A:
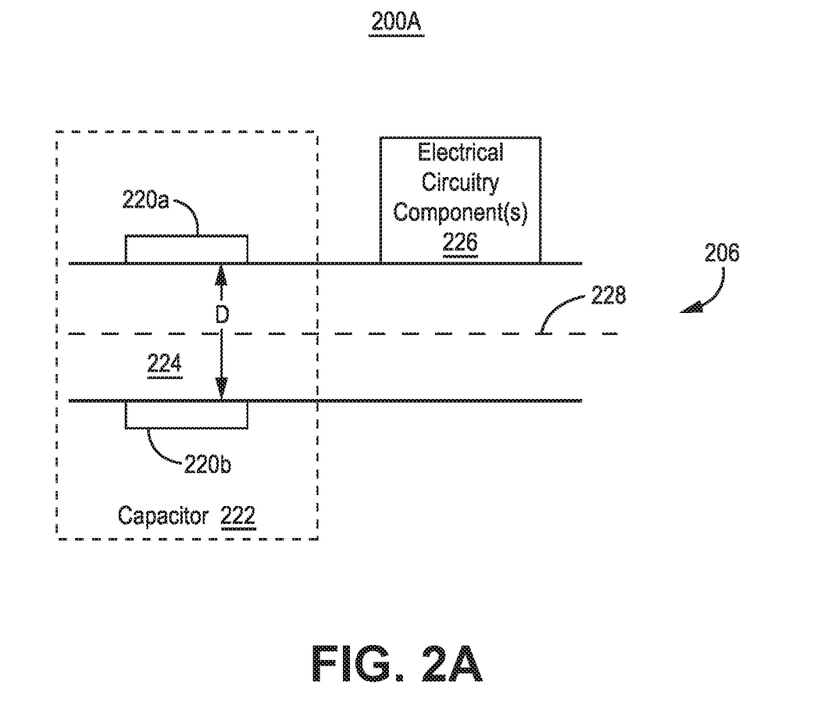
FIG. 2A illustrates a cross section of one embodiment of a capacitor.

In one embodiment, the moisture sensor circuitry 104a is formed by forming a parallel plate capacitor with the PCB 106. FIG. 2A illustrates a cross section of one embodiment of such a capacitor 200A. A first capacitor electrode 220a and a second capacitor electrode 220b of the capacitor 222 are formed on the opposing exposed sides of the dielectric layer 224 of the PCB 206, where one of the sides is where electrical circuit components 226, e.g. that are part of the moisture sensor circuitry 104a and the primary circuitry 102a are mounted on the PCB 206. The first capacitor electrode 220a and the second capacitor electrode 220b typically, but need not, have the same shape and are positioned as if mirrored around a centerline 228 bisecting the dielectric layer in a plane parallel to the first capacitor electrode 220a and the second capacitor electrode 220b. The first capacitor electrode 220a and the second capacitor electrode 220b are separated by a distance D. Each capacitor electrode 220a, 220b is made from a conductor.

Figure 2B:
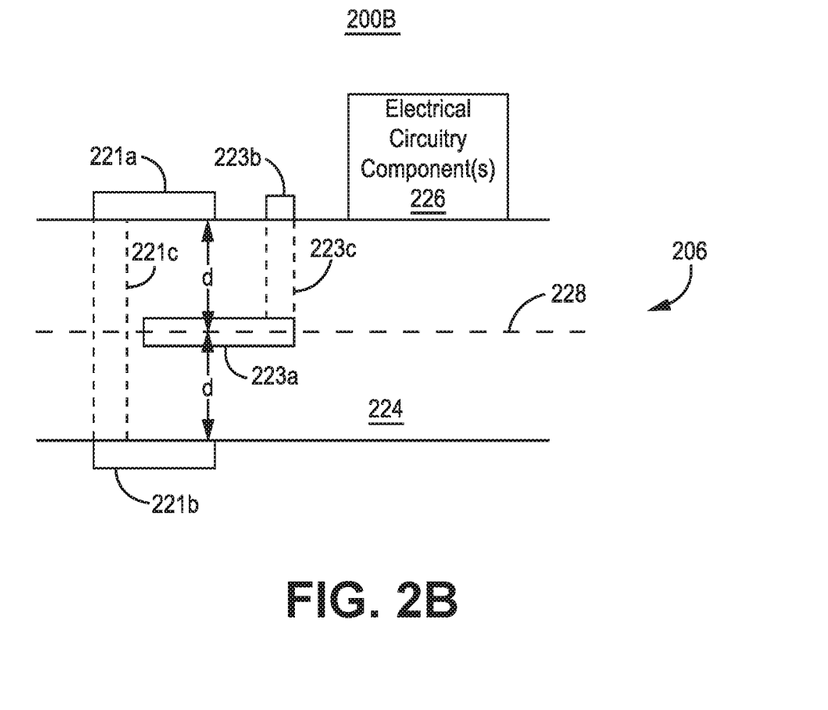
FIG. 2B illustrates a cross section of one embodiment of a multi-layer capacitor.

If the PCB 206 has more than two conductor layers or levels, e.g. is a multilayer PCB, an interdigitated or multi-layer capacitor can be formed. FIG. 2B illustrates a cross section of one embodiment of a multi-layer capacitor 200B. A first set of capacitor electrodes (first set) is formed by a first capacitor electrode 221a and a second capacitor electrode 221b are electrical coupled by a first conductive via 221c. The first conductive via 221c in the dielectric layer 224 is formed by filling with a conductor, e.g. a metal or metal alloy, in a via hole in the dielectric layer 224. Optionally, if the PCB 206 has two or more layers of dielectric, the capacitor is formed across a top dielectric layer exposed to the environment and into which moisture would first penetrate.

The first capacitor electrode 221a and the second first capacitor electrode 221b typically, but need not, have the same shape and are positioned as if mirrored around a centerline 228 bisecting the dielectric layer 224 in a plane parallel to the first capacitor electrode 221a and second capacitor electrode 221b. The first set of capacitor electrodes may alternatively in include three or more capacitor electrodes about two or more capacitor electrodes of a second set of capacitor electrodes (second set). However, for pedagogical reasons, the illustrated second set of capacitor electrodes has a single third capacitor electrode 223a. The illustrated third capacitor electrode is coupled by a second conductive via 223c to a conductive interconnect 223b. The second conductive via 223c is formed by filling a via hole in the dielectric layer 224 with a conductor. The first capacitor electrode 221a and the second capacitor electrode 221b may be electrically coupled using alternative forms of electrical coupling, e.g. conductive bond ribbons and/or conductive clips formed around the edge of the PCB 206. The various conductors or conductive elements described herein may be formed with a metal or metal alloy, e.g. gold or copper.

In one embodiment, the spacings between each of the first capacitor electrode 221a and the second capacitor electrode 221b, and the third capacitor electrode 223a are equidistance where each spacing has a distance d. The spacing between adjacent electrodes of the first set and the second set may also be equidistant when the first set and the second set respectively have more than two and one electrodes. However, in other embodiments, the spacings need not be equidistant. Further, in other embodiments, the capacitor can be formed by only one capacitor electrode on a surface of the dielectric layer 224, e.g. just the first capacitor electrode 221a, and another capacitor electrode in the dielectric layer 224, e.g. the third capacitor electrode 223a. In yet another embodiment, all capacitor electrodes can be within the dielectric layer 224, and not on the surface of the dielectric layer 224. In yet a further embodiment, all capacitor electrodes (which are conductors) can be on the same plane on or in the dielectric layer 224; one example would be an interdigitated capacitor where the capacitive electrodes of each set of electrodes are formed on the same surface of the dielectric layer 224.

Figure 3:
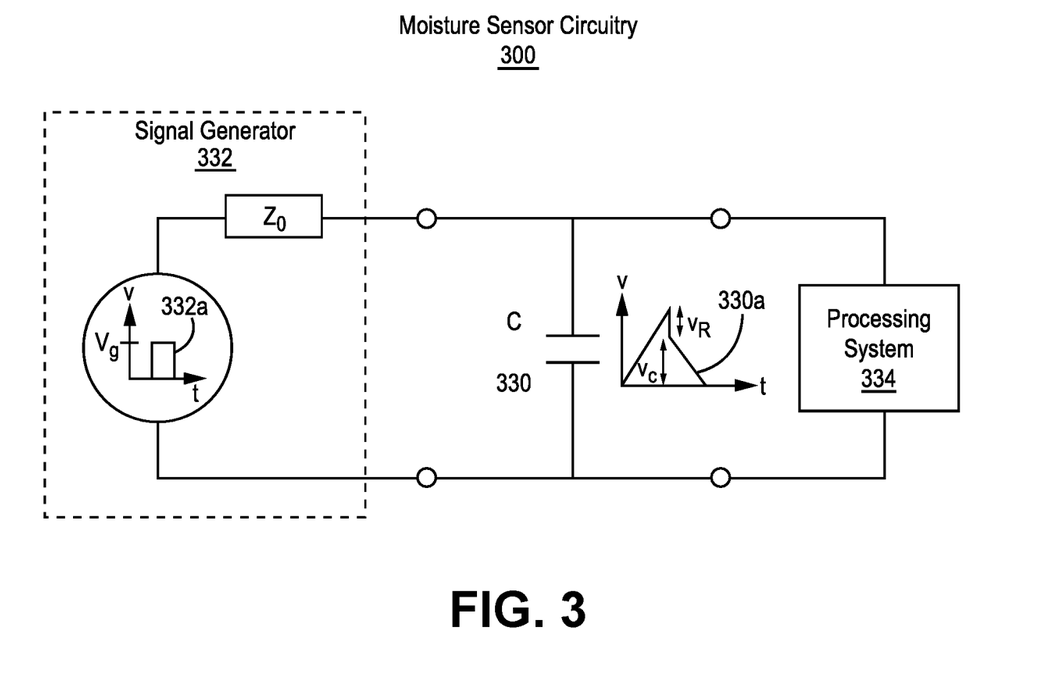
FIG. 3 illustrates a block diagram of one embodiment of moisture sensor circuitry.

FIG. 3 illustrates a block diagram of one embodiment of the moisture sensor circuitry 300. The moisture sensor circuitry 300 may also be referred to herein as a circuit configured to measure capacitance of a capacitor formed capacitive plates on and/or in the dielectric layer of the PCB. In the illustrated embodiment, the capacitor (having a capacitance C) 330, exemplified above in FIGS. 2A and 2B, formed on the PCB 206 is coupled to a signal generator (or square wave signal generator) 332 and a processing system 334. The capacitor 330 may also be referred to herein as a test capacitor.

The signal generator 332 generates a square wave voltage signal 332a having a peak to peak voltage ($V_g$), and has a characteristic impedance of $Z_o$, e.g. fifty or seventy five ohms, with little or no reactive component. The square wave voltage signal 332a, having a single period of 2 t and a peak to peak voltage of $V_g$, is illustrated in FIG. 3. The capacitor 330 integrates the square wave voltage signal 332a generating a triangle wave 330a. The triangle wave 330a has a period of 2 t, and illustrates a voltage ($V_C$) across the capacitor 330 and a voltage ($V_r$) across an equivalent series resistance (ESR) of the capacitor 330. $V_c$ is amplitude of the slope in the second half of the period of the square wave signal as illustrated in FIG. 3.

The processing system 334 comprises processing circuitry coupled to memory circuitry. The memory circuitry may store software and/or firmware executed by the processing circuitry; else the processing circuitry may have corresponding instructions encoded in hardware of the processing circuitry.

The processing system 334 may also comprise an analog to digital converter that converts the analog voltage across the capacitor 330 to a digital signal, e.g. voltage or current, that is coupled to the processing circuitry and/or memory circuitry. Alternatively, the processing circuitry comprise analog signal processing circuitry.

The processing system 334, e.g. the software and/or firmware, is configured to determine the capacitance C of the capacitor 330, where:

$$C = \frac{V_g * t}{Z_o * V_C}, \quad \text{(Equation 1)}$$

where t is one half of a period of the square wave signal. Optionally, the ESR of the capacitor 330 can be determined, where:

$$ESR = \frac{V_R * Z_o}{2 * V_g} \quad \text{(Equation 2)}$$

The processing system 334, e.g. using a digital signal processor as the processing circuitry, may determine $V_C$, and optionally also $V_r$, $V_g$, t, and $Z_o$ may be stored in the memory circuitry. Thus, using the determined and known parameters, the processing circuitry 334 can determine C and optionally the ESR. For example, the processing system 334 e.g. the software and/or firmware, can use curve fitting techniques, such as least means squares techniques, to determine the capacitance C, and optionally the ESR. Further, alternative techniques can be used to determine the capacitance C, and optionally the ESR, such as for example time domain reflectometry or frequency domain reflectometry.

Increased moisture content in the PCB results in decreased or increased dielectric, depending upon the chemical properties of the moisture, of the dielectric material used to make the PCB and also the capacitor 330. Optionally, the processing system 334 may convert the measured capacitance to a level of moisture content in the dielectric layer 224. The relationship between the level of moisture content and capacitance may be determined empirically, and represented by an equation or a look up table, e.g. stored in the memory circuitry. For example, at room temperature, the dielectric constant of the dielectric layer 224 is known and stored in the processing system 334. The moisture content measured by the moisture sensor is:

$$b*(K-K_o-a), \quad \text{(Equation 3)}$$

where $K_o$ is a known dielectric constant of the capacitor 330 at with no measurable moisture content, K is the dielectric constant corresponding to the measured capacitance C, and a and b are constants that vary depending upon the type of dielectric material of the dielectric layer 224 and capacitor design. Parameters a and b may be empirically determined. K can be determined, for example using the processing system 334 (e.g. firmware and/or software), from the capacitance C using an equation corresponding to the structure of the capacitor 330. For a parallel plate capacitor described with respect to FIG. 2A, the dielectric constant $$K = \frac{C * D}{\varepsilon_o * A}, \quad \text{(Equation 4)}$$

where $\varepsilon_o$ is permittivity in a vacuum, and A is the area of each plate (assuming the plates have the same areas). If the moisture content, capacitance, dielectric, and/or ESR values cross respective threshold values, a system or user may be alerted. As a result of the alert, the system or user may alter or disable the operation of the affected primary circuit.

Optionally, the processing system 334 may then generate the control signal 105 based upon the measured moisture content, capacitance, dielectric constant, and/or ESR. The moisture compensation circuitry 104b is configured to receive such control signal 105. For example, the moisture compensation circuitry 104b is used to adjust amplitude and/or phase of signals preceding the input of, following the output of, or within the primary circuitry 102. Thus, for example, the moisture compensation circuitry 104b may precede the input of, follow the output of, or be part of the primary circuitry 102. For example, when the moisture compensation circuitry 104b is party of the primary circuitry, the moisture compensation circuitry 104b may be one or more bias circuits to adjust the bias of one or more active circuits or devices. For pedagogical reasons, the moisture compensation circuitry 104b is illustrated as separate from and preceding the primary circuitry 102.

The moisture compensation circuitry 104b may comprise one or more of switch(es), amplifier(s), attenuators, phase shifter(s), and/or equalizer(s) which are controlled by the control signal 105. Depending upon the type(s) of moisture compensation circuitry 104b used, parameters of the moisture compensation circuitry 104a are varied in respond to the control signal 105. The parameters may include amplitude, phase, time delay, and/or any other parameter. For example, the control signal 105 may be used to disable operation of the primary circuitry 102, e.g. a power amplifier, which may not operate properly or may be susceptible to failure if operated in conditions of excess moisture. If one of the parameters, e.g. capacitance, crosses a corresponding threshold level, then the control signal 105 may be used to increase the attenuation in moisture compensation circuitry 104b (including an attenuator) at the input of the power amplifier or actuating a switch in series with a supply voltage of the power amplifier so as to disable power amplifier operation.

In one embodiment, the primary circuitry 102 is a power amplifier which can be implemented in various types of systems, e.g. communications systems. For example, the power amplifier can be implemented in various types of repeater systems. Repeater systems can be implemented in various ways.

Figure 4A:
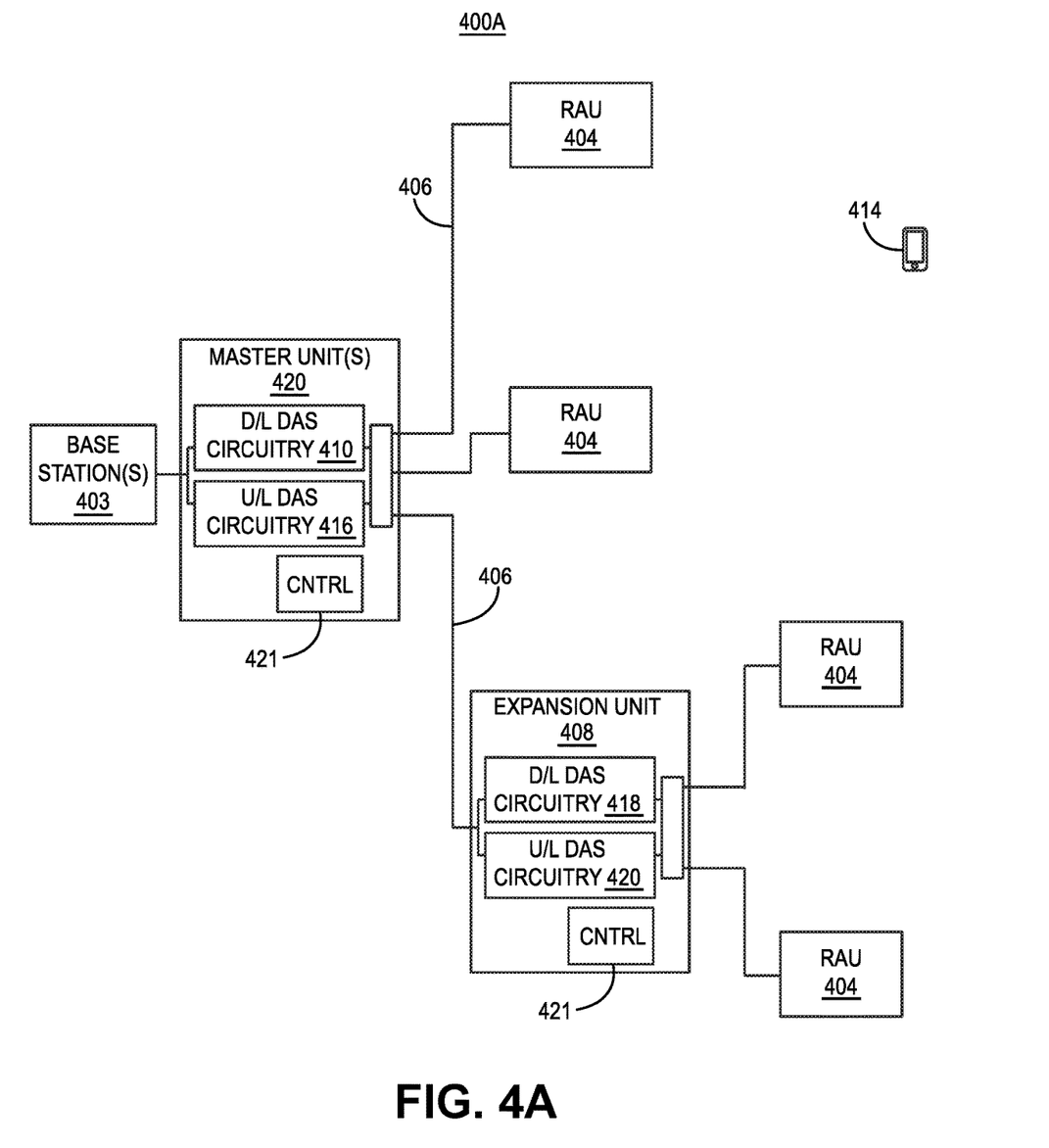
FIG. 4A illustrates a block diagram of one embodiment of a distributed antenna system including at least one moisture compensated power amplifier.

For example, a repeater system can be implemented as a distributed antenna system (DAS). FIG. 4A illustrates a block diagram of one embodiment of a distributed antenna system 400A including at least one moisture compensated power amplifier.

The DAS 400A comprises one or more master units 402 that are communicatively coupled to one or more remote antenna units including a moisture compensated power amplifier (RAUs) 404 via one or more waveguides 406, e.g. optical fibers or cables. Each RAU 404 can be communicatively coupled directly to one or more of the master units 402 or indirectly via one or more other RAUs 404 and/or via one or more expansion (or other intermediary) units 408.

The DAS 400A is coupled to one or more base stations 403 and is configured to improve the wireless coverage provided by the one or more base station 403. The capacity of each base station 403 can be dedicated to the DAS or can be shared among the DAS and a base station antenna system that is co-located with the base station and/or one or more other repeater systems.

In the embodiment shown in FIG. 4A, the capacity of one or more base stations 403 are dedicated to the DAS 400A. Optionally, the one or more base stations 403 may be co-located with the DAS 400A. The base stations 403 are coupled to the DAS 400A. It is to be understood however that other embodiments can be implemented in other ways. For example, the capacity of the one or more base stations 403 can be shared with the DAS 400A and a base station antenna system co-located with the one or more base stations 403 (for example, using a donor antenna). The one or more base stations 403 can include one or more base stations that are used to provide commercial cellular wireless service and/or one or more base stations that are used to provide public and/or private safety wireless services (for example, wireless communications used by emergency services organizations (such as police, fire and emergency medical services) to prevent or respond to incidents that harm or endanger persons or property)).

The one or more base stations 403 can be coupled to the one or more master units 402 using a network of attenuators, combiners, splitters, amplifiers, filters, cross-connects, etc., (sometimes referred to collectively as a "point-of-interface" or "POI"). This network can be included in the one or more master units 402 and/or can be separate from the one or more master units 402. This is done so that, in the downlink, the desired set of RF channels output by the base stations 403 can be extracted, combined, and routed to the appropriate master unit, and so that, in the upstream, the desired set of carriers output by the one or more master units 402 can be extracted, combined, and routed to the appropriate interface of each base station. It is to be understood, however, that this is one example and that other embodiments can be implemented in other ways.

In general, each master unit comprises downlink DAS circuitry 410 that is configured to receive one or more downlink signals from one or more base stations 403. Each base station downlink signal includes one or more radio frequency channels used for communicating in the downlink direction with user equipment 414 over a relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, or other protocol). The downlink DAS circuitry 410 in each master unit is also configured to generate one or more downlink transport signals derived from one or more base station downlink signals and to transmit one or more downlink transport signals to one or more of the RAUs 404.

Figure 4B:
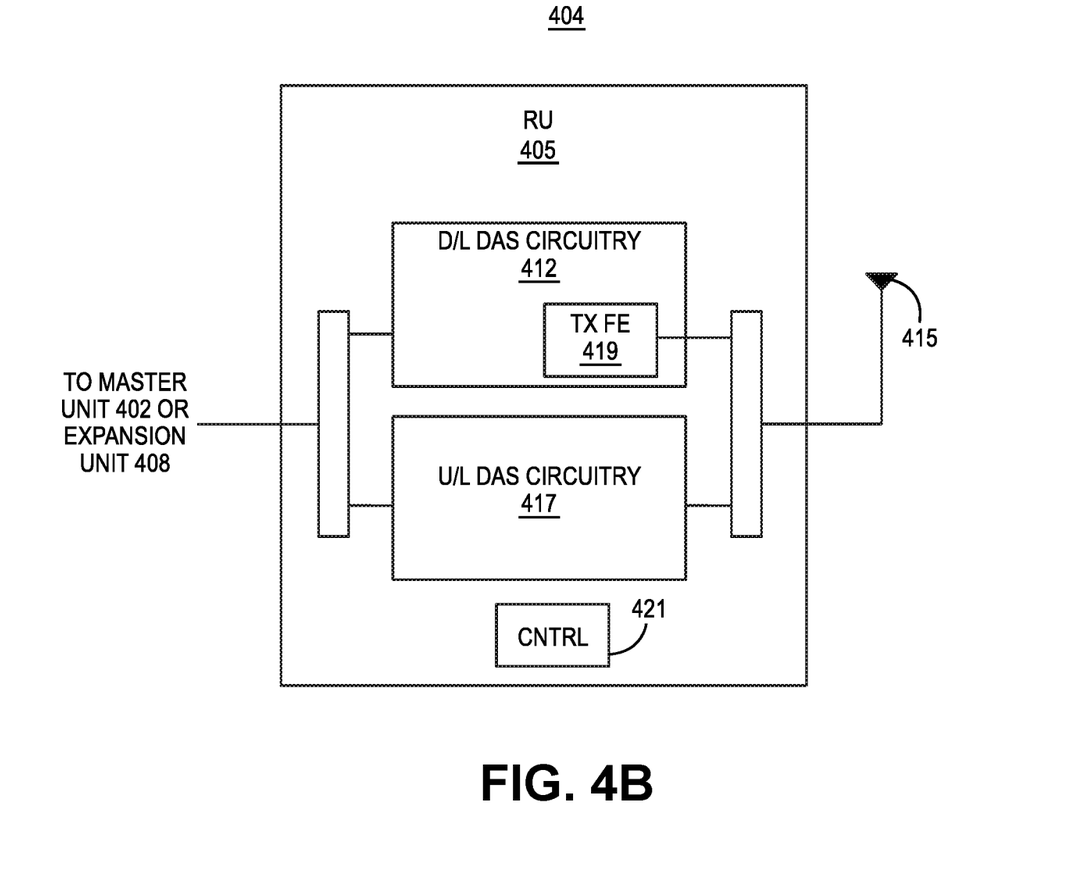
FIG. 4B illustrates a block diagram of one embodiment of a remote antenna unit including a moisture compensated power amplifier.

FIG. 4B illustrates a block diagram of one embodiment of a RAU 404 including a moisture compensated power amplifier. Each RAU 404 comprises a remote unit including a moisture compensated power amplifier (RU) 405 coupled to one or more antennas 415. Each RU 405 comprises downlink (D/L) DAS circuitry 412 and uplink (U/L) DAS circuitry 417. The downlink DAS circuitry 412 includes a transmitter front end (TX FE) 419 comprising at least one moisture compensated power amplifier.

The downlink DAS circuitry 412 is configured to receive the downlink transport signals transmitted to it from one or more master units 402 and to use the received downlink transport signals to generate one or more downlink radio frequency signals that are radiated from the one or more antennas 415, associated with that RU 405, for reception by user equipment 414. In this way, the DAS 400A increases the coverage area for the downlink capacity provided by the base stations 403. The downlink DAS circuitry 412, e.g. the power amplifier(s) in the TX FE 419, of each RU 405 also power amplify the downlink radio frequency signals.

The uplink DAS circuitry 417 is configured to receive one or more uplink radio frequency signals transmitted from the user equipment 414. These signals are analog radio frequency signals.

The uplink DAS circuitry 417 in each RU 405 is also configured to generate one or more uplink transport signals derived from the one or more remote uplink radio frequency signals and to transmit one or more uplink transport signals to one or more of the master units 402.

Returning to FIG. 4A, each master unit comprises uplink DAS circuitry 416 that is configured to receive the respective uplink transport signals transmitted to it from one or more RAUs 404 and to use the received uplink transport signals to generate one or more base station uplink radio frequency signals that are provided to the one or more base stations 403 associated with that master unit. Typically, this involves, among other things, combining or summing uplink signals received from multiple RAUs 404 in order to produce the base station signal provided to each base station. In this way, the DAS 400A increases the coverage area for the uplink capacity provided by the at least one base stations 403.

Each expansion unit 408 comprises downlink DAS circuitry (D/L DAS circuitry) 418 that is configured to receive the downlink transport signals transmitted to it from the master unit 402 (or another expansion unit 408) and transmits the downlink transport signals to one or more RAUs 404 or other downstream expansion units 408. Each expansion unit 408 also comprises uplink DAS circuitry 420 that is configured to receive the respective uplink transport signals transmitted to it from one or more RAUs 404 or other downstream expansion units 408, combine or sum the received uplink transport signals, and transmit the combined uplink transport signals upstream to the master unit 402 or other expansion unit 408. In other embodiments, one or more RAUs 404 are coupled to the one or more master units 402 via one or more other RAUs 404 (for example, where the RAUs 404 are coupled together in a daisy chain or ring topology).

The downlink DAS circuitry (D/L DAS circuitry) 410, 412, and 418 and uplink DAS circuitry (U/L DAS circuitry) 416, 417, and 420 in each master unit, RAU 404, and expansion unit 408, respectively, can comprise one or more appropriate connectors, attenuators, combiners, splitters, amplifiers, filters, diplexers, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry 410, 412, and 418 and uplink DAS circuitry 416, 417, and 420 may share common circuitry and/or components.

The DAS 400A can use digital transport, analog transport, or combinations of digital and analog transport for generating and communicating the transport signals between the master units 402, the RAU 404, and any expansion units 408. Each master unit 402, RAU 404, and expansion unit 408 in the DAS 400A also comprises a respective controller (CNTRL) 421. The controller 421 is implemented using one or more programmable processors that execute software that is configured to implement the various control functions. The controller 421 (more specifically, the various control functions implemented by the controller 421) (or portions thereof) can be implemented in other ways (for example, in a field programmable gate array (FPGA), application specific integrated circuit (ASIC), etc.). Components of system 100 may be incorporated in various components of the DAS 400A. For example, the processing circuitry 102 and/or portion(s) thereof may be incorporated in, e.g. the controller 421 of a RAU 404 or in another controller 421 incorporated into the distributed antenna system 200A. Further, for example, the moisture compensation circuitry 104b may be incorporated in an equalizer in the master unit 402, expansion unit, and/or one or more RAUs 404.

Further, a combination of one or more diplexers, duplexers, transmit/receive switches duplexers and/or other combiner systems can be used to couple the downlink DAS circuitry 412 and the uplink DAS circuitry 417 to the one or more antennas 415. The moisture compensated power amplifier may be incorporated, e.g. in the controller 421 of a RAU 404 or in another controller 421 otherwise incorporated into the distributed antenna system 400A.

Figure 5:
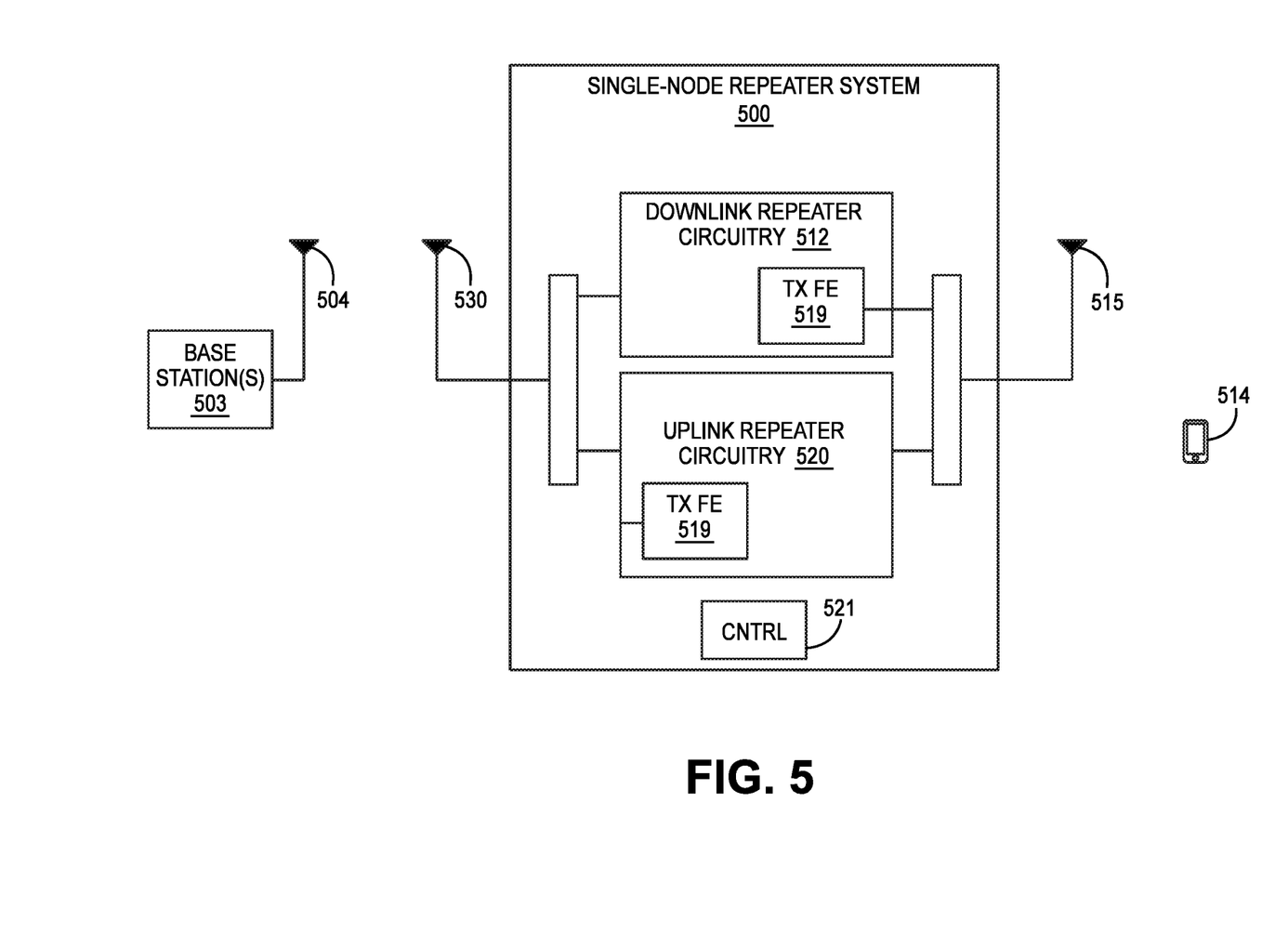
FIG. 5 illustrates a block diagram of one embodiment of a single-node repeater including a moisture compensated power amplifier.

Repeater systems can be implemented in other ways. For example, a repeater system can be implemented as a single-node repeater. FIG. 5 illustrates a block diagram of one embodiment of a single-node repeater 500 in which the power amplifier with moisture compensation described herein is implemented.

The single-node repeater 500 comprises downlink repeater circuitry 512 and uplink repeater circuitry 520. The downlink repeater circuitry 512 is configured to receive, e.g. wirelessly through at least one antenna 530 coupled to the single-node repeater 500, one or more downlink signals from one or more base stations 503 coupled to one or more antennas 504. These signals are also referred to here as "base station downlink signals." Each base station downlink signal includes one or more radio frequency channels used for communicating in the downlink direction with user equipment (UE) 514 over a relevant wireless air interface. Typically, each base station downlink signal is received as an analog radio frequency signal.

The downlink repeater circuitry 512 in the single-node repeater 500 is also configured to generate one or more downlink radio frequency signals that are radiated from one or more antennas 515 associated with the single-node repeater 500 for reception by user equipment 514. These downlink radio frequency signals are analog radio frequency signals and are also referred to here as "repeated downlink radio frequency signals." Each repeated downlink radio frequency signal includes one or more of the downlink radio frequency channels used for communicating with user equipment 514 over the wireless air interface. In this exemplary embodiment, the single-node repeater 500 is an active repeater system in which the downlink repeater circuitry 512 comprises one or more amplifiers (or other gain elements) that are used to control and adjust the gain of the repeated downlink radio frequency signals radiated from the one or more antennas 515. Each of the downlink repeater circuitry 512 and the uplink repeater circuitry 520 include at least one transmitter front end including a moisture compensated power amplifier (TX FE) 519 which, for example, power amplifies respectively the repeated downlink and uplink radio frequency signals. Such moisture compensated power amplifiers may be implemented as described above.

The uplink repeater circuitry 520 is configured to wirelessly receive through the one or more antennas 515 one or more uplink radio frequency signals transmitted from the user equipment 514. These signals are analog radio frequency signals and are also referred to here as "UE uplink radio frequency signals." Each UE uplink radio frequency signal includes one or more radio frequency channels used for communicating in the uplink direction with user equipment 514 over the relevant wireless air interface.

The uplink repeater circuitry 520 in the single-node repeater 500 is also configured to generate one or more uplink radio frequency signals that are wirelessly communicated through the at least one antenna 530 to the one or more base stations 503. These signals are also referred to here as "repeated uplink signals." Each repeated uplink signal includes one or more of the uplink radio frequency channels used for communicating with user equipment 514 over the wireless air interface. In this exemplary embodiment, the single-node repeater 500 is an active repeater system in which the uplink repeater circuitry 520 comprises one or more amplifiers (or other gain elements) that are used to control and adjust the gain of the repeated uplink radio frequency signals provided to the one or more base stations 503. Typically, each repeated uplink signal is provided to the one or more base stations 503 as an analog radio frequency signal.

The downlink repeater circuitry 512 and uplink repeater circuitry 520 can comprise one or more appropriate connectors, attenuators, combiners, splitters, amplifiers, filters, diplexers, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink repeater circuitry 512 and uplink repeater circuitry 520 may share common circuitry and/or components.

Further, a combination of two or more diplexers, duplexers, transmit/receive switches duplexers and/or other combiner systems can be used to couple the downlink DAS circuitry 512 and the uplink DAS circuitry 520 to one or more antennas 515. The single-node repeater system 500 also comprises a controller (CNTRL) 521. The controller 521 is implemented using one or more programmable processors that execute software that is configured to implement the various control functions. The controller 521 (more specifically, the various control functions implemented by the controller 521) (or portions thereof) can be implemented in other ways (for example, in a field programmable gate array (FPGA), application specific integrated circuit (ASIC), etc.). The components of the moisture compensated power amplifier system may be incorporated in various components of the single-node repeater system 500 like as described above for the DAS 400.

Figure 6:
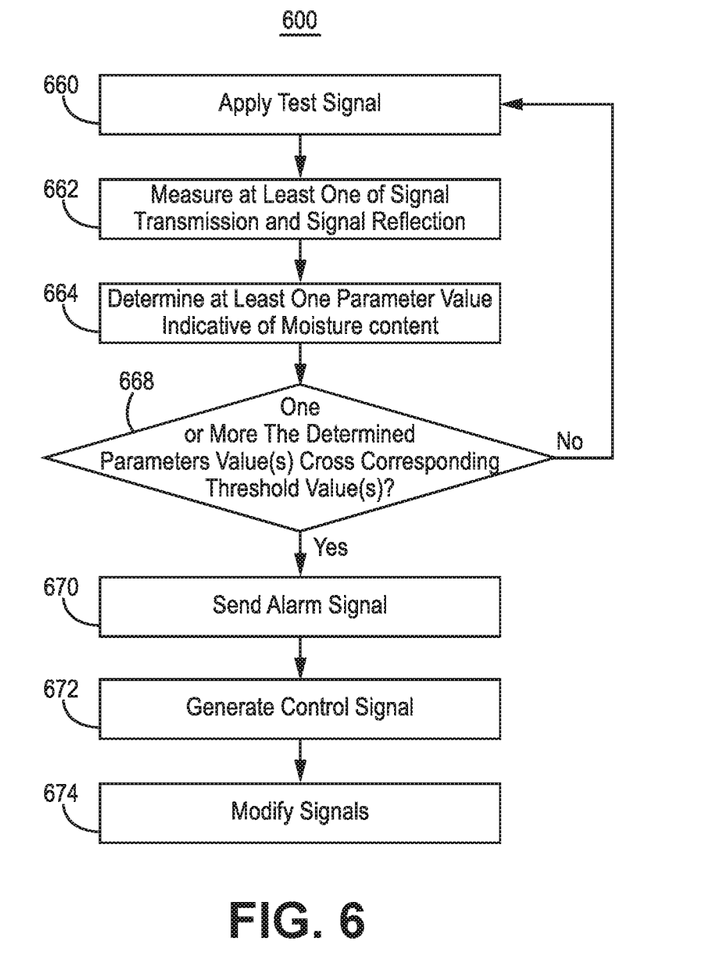
FIG. 6 illustrates a flow diagram of one embodiment of a method of moisture compensating primary circuitry.

FIG. 6 illustrates a flow diagram of one embodiment of a method of moisture compensating primary circuitry 600. To the extent that the embodiment of method 600 shown in FIG. 6 is described herein as being implemented in the systems described with respect to FIGS. 1-5, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 660, apply a test signal, e.g. a square wave voltage signal, sinusoidal voltage signal, or any other type of signal, to a test circuitry comprising a test capacitor that is formed with a dielectric layer of a PCB. The test signal, e.g. the sinusoidal voltage signal, may be fixed or varied in frequency. In block 662, measure at least one of signal transmission and signal reflection from the test circuitry. In block 664, determine at least one parameter value indicative of moisture content of the dielectric layer; optionally the at least one parameter includes at least one of test capacitor capacitance, dielectric constant of the test capacitor, moisture content of the dielectric layer, and the ESR of the test capacitor. Optionally, determine at least one other circuit element parameter value from the measured signal; such other circuit element parameter values may include a resistance of a resistor in series or shunt with test capacitor.

Optionally, in block 668, determine whether at least one or more parameter values indicative of moisture content cross corresponding parameter threshold value(s). If not, return to block 660. If yes, proceed to block 670.

For example, optionally, determine if the capacitance value crosses a capacitance threshold value. Crossing a threshold value means one of greater than or less than the threshold value. Whether crossing the threshold value means greater than or less than depends upon the corresponding parameter. For example, crossing a moisture content threshold value means that the determined moisture content is greater than the determined moisture content.

In block 670, if one or more threshold values are crossed, send an alarm (or alarm signal) to another system or user. Optionally, the alarm identifies the primary circuitry having excessive moisture content. The system or user may then elect to replace and/or disable the primary circuitry affected by excess moisture content.

Optionally, in block 672, generate a control signal with information based upon at least one of at least one of capacitance value, ESR value, moisture content value, and dielectric constant value. The information may be data modulated on a carrier wave, parameters (such as frequency) of the carrier wave, etc. Optionally, in block 674, modify signals generated by the primary circuitry based upon information in the control signal. Signals generated by the primary circuitry may be modified, for example, by affecting:

(a) operation of the primary circuitry such as by disabling the primary circuitry or by controlling a circuit element of the primary circuitry; and
(b) operation of a component external to the primary circuitry, e.g. preceding or following the primary circuitry in the signal chain. Examples of such components are provided elsewhere herein.

The processing circuitry described herein may include one or more microprocessors, microcontrollers, digital signal processing (DSP) elements, application-specific integrated circuits (ASICs), complex programmable logic devices, and/or field programmable gate arrays (FPGAs). In this exemplary embodiment, processing circuitry includes or functions with software programs, firmware, or other computer readable instructions for carrying out various process tasks, calculations, and control functions, used in the methods described herein. These instructions are typically tangibly embodied on any storage media (or computer readable medium) used for storage of computer readable instructions or data structures. Alternatively, all or part of the processing circuitry may be implemented with analog processing circuitry, e.g. implemented with operational amplifier(s).

The memory circuitry described herein can be implemented with any available storage media (or computer readable media) that can be accessed by a general purpose or special purpose computer or processor, or any programmable logic device. Suitable computer readable medium may include storage or memory media such as semiconductor, magnetic, and/or optical media. For example, computer readable media may include conventional hard disks, Compact Disk-Read Only Memory (CD-ROM), DVDs, volatile or non-volatile media such as Random Access Memory (RAM) (including, but not limited to, Dynamic Random Access Memory (DRAM)), Read Only Memory (ROM), Electrically Erasable Programmable ROM (EEPROM), and/or flash memory. Combinations of the above are also included within the scope of computer readable media.

EXEMPLARY EMBODIMENTS

Example 1 includes a method, comprising: applying a test signal to test circuitry comprising a test capacitor that is formed with a dielectric layer of a printed circuit board (PCB); measuring at least one characteristic of a least one of signal transmission and signal reflection from the test circuitry; and determining, from the at least one measured characteristic, at least one parameter value indicative of moisture content in the dielectric layer.

Example 2 includes the method of Example 1, wherein the test signal comprises one of a square wave voltage signal or a sinusoidal voltage signal.

Example 3 includes the method of Example 2, wherein a frequency of the sinusoidal voltage signal is varied.

Example 4 includes the method of any of Examples 1-3, wherein the at least one parameter value indicative of the moisture content of the dielectric layer comprises at least one of capacitance of the test capacitor, an effective series resistance of the test capacitor, a dielectric constant of the test capacitor, and a moisture content of the dielectric layer of the PCB.

Example 5 includes the method of any of Examples 1-4, further comprising determining whether one or more of the parameter values crossed corresponding parameter threshold value(s).

Example 6 includes the method of Example 5, further comprising if at least one threshold value is crossed, sending an alarm to another system or user.

Example 7 includes the method of any of Examples 1-5, further comprising: generating a control signal with information based upon at least one of a capacitance value, an ESR value, a moisture content value, and a dielectric constant value; and modifying signals generated by the primary circuitry based upon the information.

Example 8 includes the method of Example 7, wherein modifying signals generated by the primary circuit comprises modifying at least one of amplitude and phase of at least one of an input signal to and an output signal from the primary circuitry.

Example 9 includes a system, comprising: a printed circuit board (PCB) comprising at least one dielectric layer; primary circuitry formed at least one of on or with the PCB; and moisture sensor circuitry comprising a test capacitor formed with the at least one dielectric layer and at least one conductor on or in the dielectric layer, and configured to measure at least one characteristic of a least one of signal transmission and signal reflection from the test circuitry.

Example 10 includes the system of Example 9, wherein the at least one parameter value indicative of the moisture content of the dielectric layer comprises at least one of capacitance of the test capacitor, an effective series resistance of the test capacitor, a dielectric constant of the test capacitor, and a moisture content of the dielectric layer of the PCB.

Example 11 includes the system of any of Examples 9-10, wherein the moisture sensor circuitry is configured to be coupled to moisture compensation circuitry which is at least one of coupled to and a part of the primary circuitry.

Example 12 includes the system of any of Examples 9-11, wherein the moisture sensor circuitry is further configured to determine, from the at least one measured characteristic, at least one parameter value indicative of moisture content in the dielectric layer.

Example 13 includes the system of Example 12, wherein the moisture sensor circuitry is further configured to send an alarm to another system or user if one or more of the parameter values crossed corresponding parameter threshold value(s).

Example 14 includes the system of Examples 9-13, further comprising a moisture compensation circuitry that is at least one of coupled to and part of the primary circuitry; wherein the moisture sensor circuitry is further configured to generate a control signal with information based upon at least one of a capacitance value, an ESR value, a moisture content value, and dielectric constant value; and wherein signals generated by the primary circuitry are modified based upon the information.

Example 15 includes the system of Example 14, wherein the moisture compensation circuitry is an equalizer in a signal chain including the primary circuitry.

Example 16 includes the system of any of Examples 9-15, wherein the test capacitor is a parallel plate capacitor having electrodes on opposing sides of a dielectric layer.

Example 17 includes the system of any of Example 9-16, wherein the moisture sensor circuitry further comprises: a signal generator coupled to both terminals of the test capacitor and configured to generate a square wave having a period T; a processing system, comprising processing circuitry coupled to memory circuitry, coupled to both terminals of the test capacitor; and wherein the test capacitor integrates the square wave; and wherein determining at least one parameter indicative of moisture content is determined, by the processing system, from the integrated square wave.

Example 18 includes the system of any of Examples 9-17, wherein the primary circuitry is a power amplifier.

Example 19 includes the system of any of Examples 9-18, wherein system comprises one of a remote antenna unit of a distributed antenna system and a single-node repeater.

Example 20 includes a program product comprising a non-transitory processor readable medium on which program instructions are embodied, wherein the program instructions are configured, when executed by at least one programmable processor, to cause the at least one programmable processor to: cause a signal generator to apply a test signal to test circuitry comprising a test capacitor that is formed with a dielectric layer of a printed circuit board (PCB); measure at least one characteristic of a least one of signal transmission and signal reflection from the test circuitry; and determine, from the at least one measured characteristic, at least one parameter value indicative of moisture content in the dielectric layer.

Example 21 includes the program product of Example 20, wherein the at least one parameter value indicative of the moisture content of the dielectric layer comprises at least one of capacitance of the test capacitor, an effective series resistance of the test capacitor, a dielectric constant of the test capacitor, and a moisture content of the dielectric layer of the PCB.

Example 22 includes the program product of any of Examples 20-21, wherein the program instructions are configured, when executed by at least one programmable processor, to further cause the at least one programmable processor to determine, from the at least one measured characteristic, at least one parameter value indicative of moisture content in the dielectric layer.

Example 23 includes the program product of any of Examples 20-22, wherein the program instructions are configured, when executed by at least one programmable processor, to further cause the at least one programmable processor to send an alarm to another system or user if at least one threshold value is crossed.

Example 24 includes the program product of any of Examples 20-23, wherein the program instructions are configured, when executed by at least one programmable processor, to further cause the at least one programmable processor to: generate a control signal with information based upon at least one of a capacitance value, an ESR value, a moisture content value, and a dielectric constant value; and modify signals generated by the primary circuitry based upon the information.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal.

Terms of relative position as used in this application are defined based on a plane parallel to the conventional plane or working surface of a layer or substrate, regardless of orientation. The term "horizontal" or "lateral" as used in this application are defined as a plane parallel to the conventional plane or working surface of a layer or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of a layer or substrate, regardless of orientation.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims. Therefore, it is manifestly intended that this invention be limited only by the claims and the equivalents thereof.

The invention claimed is:

1. A method, comprising:
applying a test signal to test circuitry comprising a test capacitor that is formed with a dielectric layer of a printed circuit board (PCB);
measuring a voltage across the test capacitor that is formed with the dielectric layer of the PCB; and
determining, from the measured voltage, at least one of (a) a capacitance and an equivalent series resistance (ESR) of the test capacitor formed with the dielectric layer of the PCB, and (b) a moisture content of the dielectric layer of the PCB.

2. The method of claim 1, wherein the test signal comprises one of a square wave voltage signal or a sinusoidal voltage signal.

3. The method of claim 2, wherein a frequency of the sinusoidal voltage signal is varied.

4. The method of claim 1, further comprising determining whether one or more of determined parameter values crosses corresponding parameter threshold value(s).

5. The method of claim 4, further comprising determining that parameter threshold value(s) have been crossed, then sending an alarm to another system or a user.

6. The method of claim 1, further comprising:
generating a control signal with information based upon at least one of (a) the determined capacitance, (b) the determined ESR, and (c) the determined moisture content; and
modifying signals generated by a primary circuitry based upon the information.

7. The method of claim 6, wherein modifying signals generated by the primary circuitry comprises modifying at least one of amplitude, phase, and time delay of at least one of fa) an input signal to the primary circuitry and an output signal from the primary circuitry.

8. A system, comprising:
a printed circuit board (PCB) comprising at dielectric layer;
primary circuitry formed at least one of on or with the PCB; and
moisture sensor circuitry comprising a test capacitor formed with the dielectric layer of the PCB and at least one conductor on or in the dielectric layer, and configured to apply a test signal to the test capacitor formed with the dielectric layer of the PCB, measure a voltage across the test capacitor formed with the dielectric layer of the PCB and determine, from the measured voltage, at least one of (a) a capacitance and an equivalent series resistance (ESR) of the test capacitor formed with the dielectric layer of the PCB, and (b) a moisture content of the dielectric layer of the PCB.

9. The system of claim 8, wherein the moisture sensor circuitry is configured to be coupled to moisture compensation circuitry which is at least one of (a) coupled to a part of the primary circuitry and (b) the part of the primary circuitry.

10. The system of claim 8, wherein the moisture sensor circuitry is further configured to send an alarm to another system or an user if at least one of the determined capacitance, the determined ESR, and the determined moisture content crosses corresponding parameter threshold value(s).

11. The system of claim 8, further comprising moisture compensation circuitry that is at least one of (a) coupled to the primary circuitry and (b) part of the primary circuitry; and
wherein the moisture sensor circuitry is further configured to generate a control signal with information based upon at least one of La) the determined capacitance, and the determined ESR, and (b) the determined moisture content;
wherein signals generated by the primary circuitry are modified based upon the information.

12. The system of claim 8, wherein the test capacitor is a parallel plate capacitor having electrodes on opposing sides of the dielectric layer.

13. The system of claim 8, wherein the moisture sensor circuitry further comprises:
a signal generator coupled to both terminals of the test capacitor and configured to generate the test signal that is a square wave voltage signal which has a period T;
a processing circuitry, coupled to both terminals of the test capacitor; and
wherein the test capacitor is configured to integrate the square wave voltage signal;
wherein the processing circuitry is configured to determine the capacitance and the equivalent series resistance of the test capacitor when the square wave voltage signal is applied to the test capacitor is determined from an integrated square wave voltage signal.

14. The system of claim 8, wherein the primary circuitry is a power amplifier.

15. The system of claim 8, wherein the system comprises one of (a) a remote antenna unit of a distributed antenna system and (b) a single-node repeater.

16. A program product comprising a non-transitory processor readable medium on which program instructions are embodied, wherein the program instructions are configured, when executed by at least one programmable processor, to cause the at least one programmable processor to:
cause a signal generator to apply a test signal to test circuitry comprising a test capacitor that is formed with a dielectric layer of a printed circuit board (PCB);
obtain a measurement of a measured voltage across the test capacitor that is formed with the dielectric layer of the PCB; and
determine, from the measured voltage, at least one of, (a) a capacitance and an equivalent series resistance (ESR) of the test capacitor formed with the dielectric layer of the PCB, and (b) a moisture content of the dielectric layer of the PCB.

17. The program product of claim 16, wherein the program instructions are configured, when executed by the at least one programmable processor, to further cause the at least one programmable processor to determine that one or more parameter threshold value(s) crosses corresponding parameter threshold value(s), and send an alarm to another system or an user.

18. The program product of claim 16, wherein the program instructions are configured, when executed by the at least one programmable processor, to further cause the at least one programmable processor to:
cause generation of a control signal with information based upon at least one of (a) the determined capacitance, the determined ESR, and (b) the determined moisture content; and
cause modification of signals generated by a primary circuitry based upon the information.

* * * * *

UNITED STATES PATENT AND TRADEMARK OFFICE
CERTIFICATE OF CORRECTION

PATENT NO. : 11,209,377 B2
APPLICATION NO. : 16/748140
DATED : December 28, 2021
INVENTOR(S) : Rauwolf et al.

It is certified that error appears in the above-identified patent and that said Letters Patent is hereby corrected as shown below:

In the Claims

At Column 15, Line 11, please replace "of fa)" with --of (a)--

At Column 15, Line 11, please replace "and an output" with --and (b) an output--

At Column 15, Line 14, please replace "comprising at dielectric" with --comprising a dielectric--

At Column 15, Line 45, please replace "one of La)" with --one of (a)--

Signed and Sealed this
Twentieth Day of December, 2022

Katherine Kelly Vidal
*Director of the United States Patent and Trademark Office*